(12) United States Patent
Kiyohara

(10) Patent No.: US 10,796,897 B2
(45) Date of Patent: Oct. 6, 2020

(54) SUPERCRITICAL FLUID PRODUCING APPARATUS AND SUBSTRATE PROCESSING APPARATUS

(71) Applicant: Tokyo Electron Limited, Tokyo (JP)

(72) Inventor: Yasuo Kiyohara, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 237 days.

(21) Appl. No.: 15/828,636

(22) Filed: Dec. 1, 2017

(65) Prior Publication Data

US 2018/0158676 A1    Jun. 7, 2018

(30) Foreign Application Priority Data

Dec. 6, 2016   (JP) .................. 2016-236796

(51) Int. Cl.
| | |
|---|---|
| *H01L 21/02* | (2006.01) |
| *B01D 11/04* | (2006.01) |
| *F26B 5/00* | (2006.01) |
| *H01L 21/67* | (2006.01) |

(52) U.S. Cl.
CPC .... *H01L 21/02101* (2013.01); *B01D 11/0407* (2013.01); *F26B 5/005* (2013.01); *H01L 21/67017* (2013.01); *H01L 21/67109* (2013.01)

(58) Field of Classification Search
CPC ................................. H01L 21/02101
See application file for complete search history.

(56) References Cited

U.S. PATENT DOCUMENTS

| | | | | |
|---|---|---|---|---|
| 2013/0333726 A1* | 12/2013 | Goshi | ....................... | B08B 3/10 |
| | | | | 134/18 |
| 2014/0262024 A1* | 9/2014 | Cho | .................. | H01L 21/67051 |
| | | | | 156/345.1 |
| 2015/0258584 A1* | 9/2015 | Mitsuoka | ................. | B01D 3/00 |
| | | | | 202/175 |

FOREIGN PATENT DOCUMENTS

| | | |
|---|---|---|
| JP | 2013-012538 A | 1/2013 |
| JP | 2013-016798 A | 1/2013 |

* cited by examiner

*Primary Examiner* — Jason Y Ko

(74) *Attorney, Agent, or Firm* — Abelman, Frayne & Schwab

(57) ABSTRACT

A supercritical fluid producing apparatus according to the present disclosure includes a gas supply line, a cooler, a pump, a buffer tank, a heating device, and a supercritical fluid supply line. An inlet port into which a processing fluid from the pump flows is formed at a predetermined position on the buffer tank, and an outlet port through which the processing fluid flows out is formed at a different position from the inlet port. The buffer tank includes a buffer tank body that stores the processing fluid from the pump, and a heater that heats the processing fluid sent into the buffer tank body.

5 Claims, 5 Drawing Sheets

SUPERCRITICAL FLUID PRODUCING APPARATUS AND SUBSTRATE PROCESSING APPARATUS

CROSS-REFERENCE TO RELATED APPLICATIONS

This application is based on and claims priority from Japanese Patent Application No. 2016-236796, filed on Dec. 6, 2016, with the Japan Patent Office, the disclosure of which is incorporated herein in its entirety by reference.

TECHNICAL FIELD

The present disclosure relates to a supercritical fluid producing apparatus and a substrate processing apparatus.

BACKGROUND

In a semiconductor device manufacturing process in which a laminated structure of an integrated circuit is formed on the surface of, for example, a semiconductor wafer (hereinafter, referred to as a "wafer") as a substrate, a liquid processing process for processing the wafer surface using a liquid is performed, and such a liquid processing process includes, for example, removing fine dust or a natural oxide film on the wafer surface using a cleaning liquid such as, for example, a chemical liquid.

There has been known a method using a processing liquid in a supercritical state, to remove a liquid remaining on the surface of the wafer in the liquid processing process.

For example, Japanese Laid-Open Patent Publication No. 2013-012538 discloses a substrate processing apparatus in which a liquid remaining on a substrate is removed by causing a fluid in a supercritical state to be in contact with the substrate. Further, Japanese Laid-Open Patent Publication No. 2013-016798 discloses a substrate processing apparatus in which a substrate is dried by dissolving an organic solvent on the substrate using a supercritical fluid.

SUMMARY

An aspect of the present disclosure provides a supercritical fluid producing apparatus including: a gas supply line that supplies a gaseous processing fluid; a cooler connected to the gas supply line and configured to cool the gaseous processing fluid from the gas supply line so as to produce a liquid processing fluid; a pump connected to the cooler and configured to send out the liquid processing fluid from the cooler by increasing a pressure of the liquid processing fluid; a buffer tank connected to the pump and configured to absorb a pressure fluctuation or pulsation of the processing fluid from the pump; a heating device connected to the buffer tank and configured to heat the processing fluid from the buffer tank; and a supercritical fluid supply line connected to the heating device and configured to send out a processing fluid in a supercritical state from the heating device, wherein an inlet port into which the processing fluid from the pump flows is formed at a predetermined position on the buffer tank, and an outlet port through which the processing fluid flows out is formed at a position on the buffer tank which is different from the inlet port, and the buffer tank includes a buffer tank body that stores the processing fluid from the pump, and a heater that heats the processing fluid sent into the buffer tank body.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
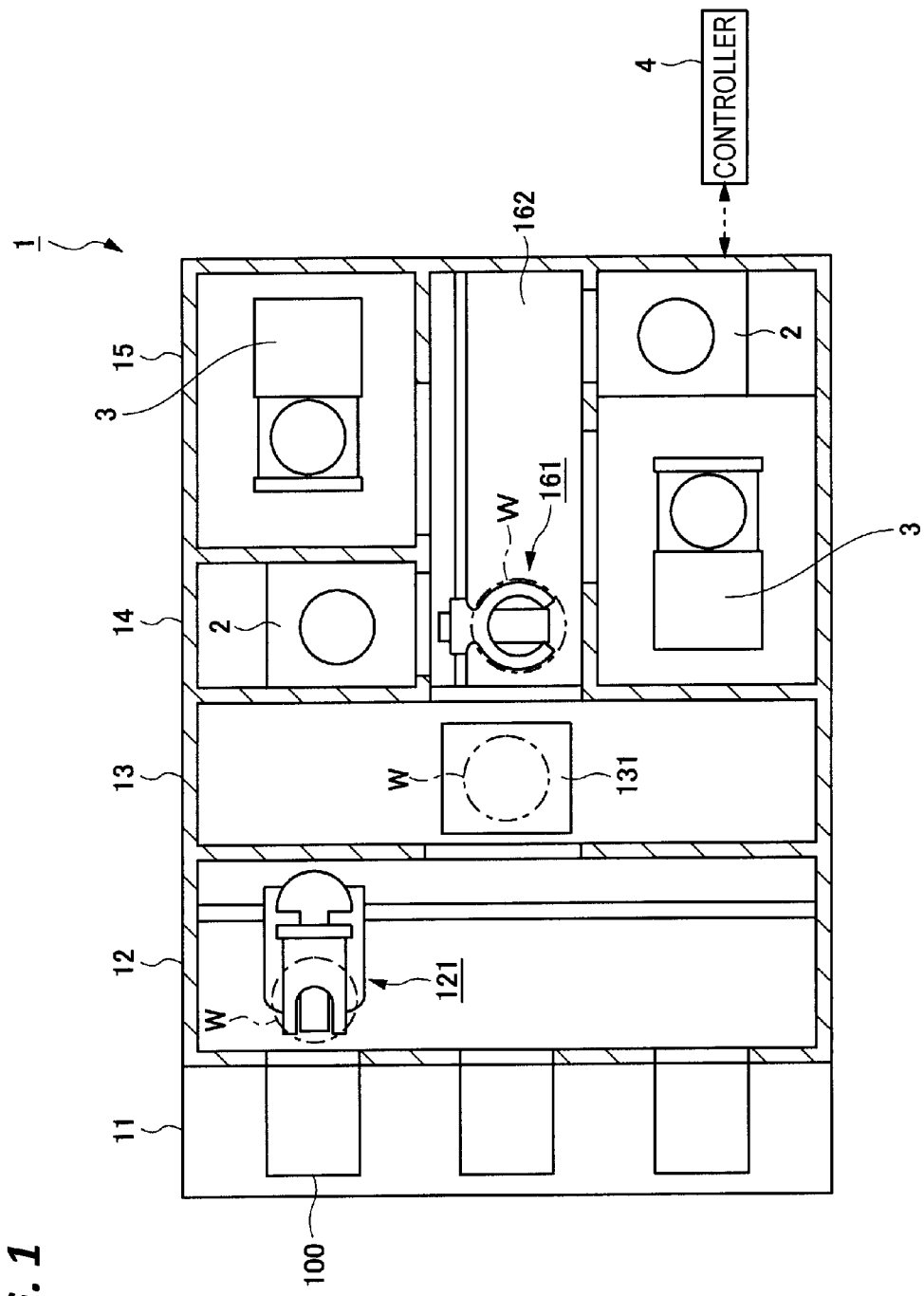
FIG. 1 is a horizontal sectional plan view of an entire configuration of a cleaning processing system.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the substrate processing apparatus of the related art which uses a high-pressure fluid such as, for example, a supercritical fluid, the high-pressure fluid is supplied from a high-pressure fluid producing apparatus. In the high-pressure fluid producing apparatus, an accumulator is provided to absorb a pressure fluctuation when the high-pressure fluid is supplied to the processing container or a pulsation of the high-pressure fluid by a pump. In this accumulator, a buffer container is filled with a compressed gas which is enclosed in a rubber film or the like, and when a high-pressure fluid is supplied from the side of a supply pipe, the enclosed compressed gas absorbs a pressure fluctuation of the high-pressure fluid.

However, in the accumulator of the related art, an inlet port through which the high-pressure fluid flows into the buffer container, and an outlet port through which the high-pressure fluid flows out from the buffer container are shared. Thus, the high-pressure fluid filled in the buffer container of the accumulator stays, and as a result, particles existing in the high-pressure fluid also stay in the buffer container of the accumulator. When the particles staying in the buffer container are intermittently discharged to the supply pipe, the substrate processing process may be adversely affected.

The present disclosure has been made under the foregoing circumstances, and an object of the present disclosure is to provide a supercritical fluid producing apparatus and a substrate processing apparatus which are capable of absorbing a pressure fluctuation or pulsation of a processing fluid flowing in a supercritical fluid producing apparatus and suppressing the problem in that particles stay in a buffer tank.

An aspect of the present disclosure provides a supercritical fluid producing apparatus including: a gas supply line that supplies a gaseous processing fluid; a cooler connected to the gas supply line and configured to cool the gaseous processing fluid from the gas supply line so as to produce a liquid processing fluid; a pump connected to the cooler and configured to send out the liquid processing fluid from the cooler by increasing a pressure of the liquid processing fluid; a buffer tank connected to the pump and configured to absorb a pressure fluctuation or pulsation of the processing fluid from the pump; a heating device connected to the buffer tank and configured to heat the processing fluid from the buffer tank; and a supercritical fluid supply line connected to the heating device and configured to send out a processing fluid in a supercritical state from the heating device, wherein an inlet port into which the processing fluid from the pump flows is formed at a predetermined position on the buffer tank, and an outlet port through which the processing fluid flows out is formed at a position on the buffer tank which is different from the inlet port, and the buffer tank includes a buffer tank body that stores the processing fluid from the pump, and a heater that heats the processing fluid sent into the buffer tank body.

In the supercritical fluid producing apparatus, a volume of the buffer tank body is 500 ml or more and 1,000 ml or less.

In the supercritical fluid producing apparatus, the inlet port of the buffer tank is positioned at a vertically upper portion of the buffer tank, and the outlet port of the buffer tank is positioned at a vertically lower portion of the buffer tank.

In the supercritical fluid producing apparatus, a circulation line is provided to interconnect a downstream side of the heating device and an upstream side of the cooler, and a pressure regulating valve is provided in the circulation line.

In the supercritical fluid producing apparatus, wherein a storage tank is provided between the cooler and the pump to store the liquid processing fluid liquefied by being cooled in the cooler.

Another aspect of the present disclosure provides a substrate processing apparatus including: the above-described supercritical fluid producing apparatus; and a processing container in which a supercritical fluid processing is performed on a substrate using a processing fluid in a supercritical state from the supercritical fluid producing apparatus.

According to the present disclosure, it is possible to absorb a pressure fluctuation or pulsation of the processing fluid flowing in the supercritical fluid producing apparatus, and suppress the problem in that particles stay in the buffer tank.

[Configuration of Cleaning Processing System]

FIG. 1 is a horizontal sectional plan view illustrating an entire configuration of a cleaning processing system 1.

The cleaning processing system 1 includes a plurality of cleaning apparatuses 2 (two cleaning apparatuses 2 in the example illustrated in FIG. 1) that perform a cleaning processing by supplying a cleaning liquid to wafers W, and a plurality of supercritical processing apparatuses 3 (two supercritical processing apparatuses 3 in the example illustrated in FIG. 1) that remove a drying prevention liquid (isopropyl alcohol (IPA) in the present exemplary embodiment) remaining on the cleaned wafers W by causing the drying prevention liquid to be in contact with a processing liquid in a supercritical state (carbon dioxide ($CO_2$) in the present exemplary embodiment).

In the cleaning processing system 1, front opening unified pods (FOUPs) 100 are placed in a placement section 11, and a wafer W accommodated in each FOUP 100 is delivered to a cleaning processing section 14 and a supercritical processing section 15 via a carry in/out section 12 and a delivery section 13. In the cleaning processing section 14 and the supercritical processing section 15, first, the wafer W is carried into a cleaning apparatus 2 provided in the cleaning processing section 14 and subjected to a cleaning processing. Then, the wafer W is carried into a supercritical processing apparatus 3 provided in the supercritical processing section 15 and subjected to a drying processing for removing the IPA on the wafer W. In FIG. 1, the reference numeral "121" indicates a first conveyance mechanism that conveys the wafer W between the FOUP 100 and the delivery section 13, and the reference numeral "131" indicates a delivery shelf that serves as a buffer for temporarily placing thereon the wafer W to be conveyed between the carry in/out section 12 and the cleaning processing section 14 or the supercritical processing section 15.

A wafer conveyance path 162 is connected to an opening of the delivery section 13, and the cleaning processing section 14 and the supercritical processing section 15 are provided along the wafer conveyance path 162. In the cleaning processing section 14, one cleaning apparatus 2 is disposed at each of the opposite sides of the wafer conveyance path 162 such that total two cleaning apparatuses 2 are provided. Meanwhile, in the supercritical processing section 15, one supercritical processing apparatus 3 is disposed at each of the opposite sides of the wafer conveyance path 162 such that total two supercritical processing apparatuses 1 are provided. A second conveyance mechanism 161 is disposed in the wafer conveyance path 162 to be movable within the wafer conveyance path 162. The wafer W placed on the delivery shelf 131 is received by the second conveyance mechanism 161, and the second conveyance mechanism 161 carries the wafer W into the cleaning apparatus 2 and the supercritical processing apparatus 3. Meanwhile, the number and the arrangement forms of the cleaning apparatuses 2 and the supercritical processing apparatuses 3 are not specifically limited, and an appropriate number of cleaning apparatuses 2 and supercritical processing apparatuses 3 are arranged in an appropriate form according to, for example, the number of wafers W to be processed per unit time and processing time of each of the cleaning apparatuses 2 and the supercritical processing apparatuses 3.

Each cleaning apparatus 2 is configured as a single wafer type apparatus which cleans wafers W one by one through, for example, spin cleaning. In this case, the cleaning processing of a wafer W may be performed by supplying a cleaning chemical liquid or a rinse liquid for washing off the chemical liquid to the processed surface of the wafer W at an appropriate timing while rotating the wafer W in a horizontally held state around a vertical axis. The chemical liquid and the rinse liquid used in the cleaning apparatus 2 are not specifically limited. For example, an SC1 liquid (i.e., a mixed solution of ammonia and hydrogen peroxide water) which is an alkaline chemical liquid may be supplied to the wafer W so as to remove particles or organic contaminants from the wafer W. Then, deionized water (DIW) which is a rinse liquid may be supplied to the wafer W so as to wash off the SC1 liquid from the wafer W. In addition, a dilute hydrofluoric acid (DHF) aqueous solution which is an acidic chemical liquid may be supplied to the wafer W so as to remove a natural oxide film, and then, DIW may be supplied to the wafer W so as to wash off the dilute hydrofluoric acid aqueous solution from the wafer W.

When the rinsing processing with the DIW is completed, the cleaning apparatus 2 supplies IPA as a drying prevention liquid to the wafer W while rotating the wafer W, so as to replace the DIW remaining on the processed surface of the wafer W with the IPA. Thereafter, the rotation of the wafer W is gently stopped. At this time, the IPA is supplied in a sufficient amount to the wafer W, and the surface of the wafer W on which a pattern of a semiconductor has been formed becomes a state where the IPA is applied, so that a liquid film of the IPA is formed on the surface of the wafer W. The wafer W is carried out from the cleaning apparatus 2 by the second conveyance mechanism 161 while being kept in the state where the IPA has been applied.

The IPA applied to the surface of the wafer W in this way has a function to prevent the drying of the wafer W. Especially, in order to suppress an occurrence of a so-called pattern collapse on the wafer W due to evaporation of the IPA during the conveyance of the wafer W from the cleaning apparatus 2 to the supercritical processing apparatus 3, the cleaning apparatus 2 applies the IPA in a sufficient amount to the wafer W such that an IPA film having a relatively thick thickness is formed on the surface of the wafer W.

The wafer W carried out from the cleaning apparatus 2 is carried into the processing container of the supercritical processing apparatus 3 by the second conveyance mechanism 161 in the state where the IPA has been applied, and the IPA drying processing is performed in the supercritical processing apparatus 3.

[Supercritical Processing Apparatus]

Hereinafter, details of the drying processing performed in the supercritical processing apparatus 3 using a supercritical fluid will be described. First, an exemplary configuration of the processing container of the supercritical processing apparatus 3 into which a wafer W is carried will be described. Then, an exemplary configuration of the entire system of the supercritical processing apparatus 3 will be described.

Figure 2:
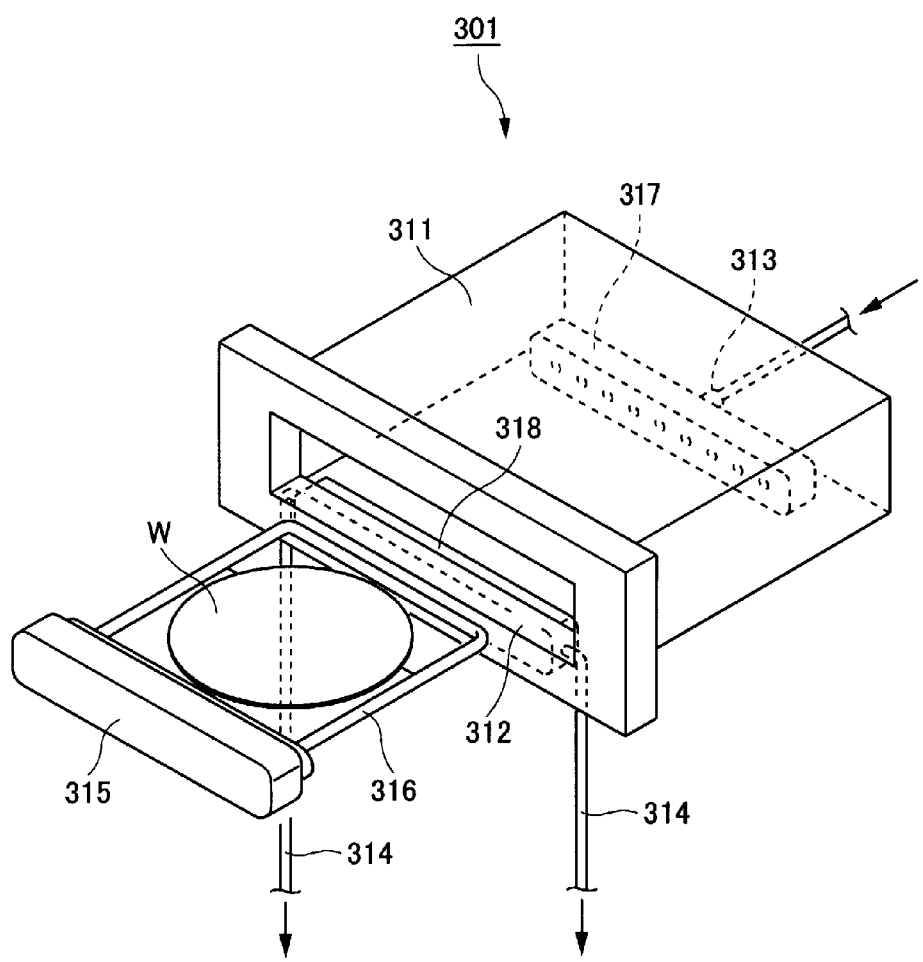
FIG. 2 is a perspective view illustrating the external appearance of an exemplary processing container of a supercritical processing apparatus.

FIG. 2 is a perspective view illustrating the external appearance of a processing container 301 of the supercritical processing apparatus 3.

The processing container 301 includes a housing-shaped container body 311 having an opening 312 for carry in/out of a wafer W, a holding plate 316 that horizontally holds a wafer W to be processed, and a lid member 315 that supports the holding plate 316 and seals the opening 312 when the wafer W is carried into the container body 311.

The container body 311 is a container in which a processing space capable of accommodating a wafer W having a diameter of, for example, 300 mm is formed, and a supply port 313 and a discharge port 314 are formed on the wall portions of the container body 311. The supply port 313 and the discharge port 314 are connected to supply lines provided on the upstream and downstream sides of the container body 301, respectively, so as to circulate the processing fluid. Meanwhile, although FIG. 2 illustrates one supply port 313 and two discharge ports 314, the number of the supply ports 313 and the discharge ports 314 is not specifically limited.

A fluid supply header 317 is provided on one internal wall portion of the container body 311 to communicate with the supply port 313, and a fluid discharge header 318 is provided on the other internal wall portion of the container body 311 to communicate with the discharge port 314. A plurality of holes are formed in the fluid supply header 317, and a plurality of holes are also formed in the fluid discharge header 318. The fluid supply header 317 and the fluid discharge header 318 are provided to face each other. The fluid supply header 317 functioning as a fluid supply unit supplies the processing fluid into the container body 311 in the substantially horizontal direction. Here, the horizontal direction refers to a direction perpendicular to the vertical direction in which the gravity acts, and generally refers to a direction parallel with the direction in which the flat surface of the wafer W held by the holding plate 316 extends. The fluid discharge header 318 functioning as a fluid discharge unit discharging the fluid inside the processing container 301 guides and discharges the fluid inside the container body 311 to the outside of the container body 311. The fluid discharged to the outside of the container body 311 through the fluid discharge header 318 contains not only the processing fluid supplied into the container body 311 through the fluid supply header 317 but also the IPA dissolved in the processing fluid on the surface of the wafer W. In this way, since the processing fluid is supplied into the container body 311 from the holes of the fluid supply header 317, and the fluid is discharged from the inside of the container body 311 through the holes of the fluid discharge header 318, a laminar flow of the processing fluid flowing substantially in parallel with the surface of the wafer W is formed inside the container body 311.

From the viewpoint of reducing a load that may be applied to the wafer W when the processing fluid is supplied into the container body 311 and when the fluid is discharged from the container body 311, a plurality of fluid supply headers 317 and a plurality of fluid discharge headers 318 may be provided. In the supercritical processing apparatus 3 illustrated in FIG. 3 to be described later, two supply lines for supplying the processing fluid are connected to the processing container 301. However, in order to facilitate the understanding, FIG. 2 illustrates only one supply port 313 and only one fluid supply header 317 which are connected to one supply line.

The processing container 301 further includes a pressing mechanism (not illustrated). The pressing mechanism performs a function to press the lid member 315 toward the container body 311, against the internal pressure caused by the processing fluid in the supercritical state that is supplied into the processing space, so as to seal the processing space. In addition, for example, a heat insulating material or a tape heater may be provided on the surface of the container body 311, such that the processing fluid supplied into the processing space may maintain the temperature thereof in the supercritical state.

[Configuration of Entire System of Supercritical Processing Apparatus]

Figure 3:
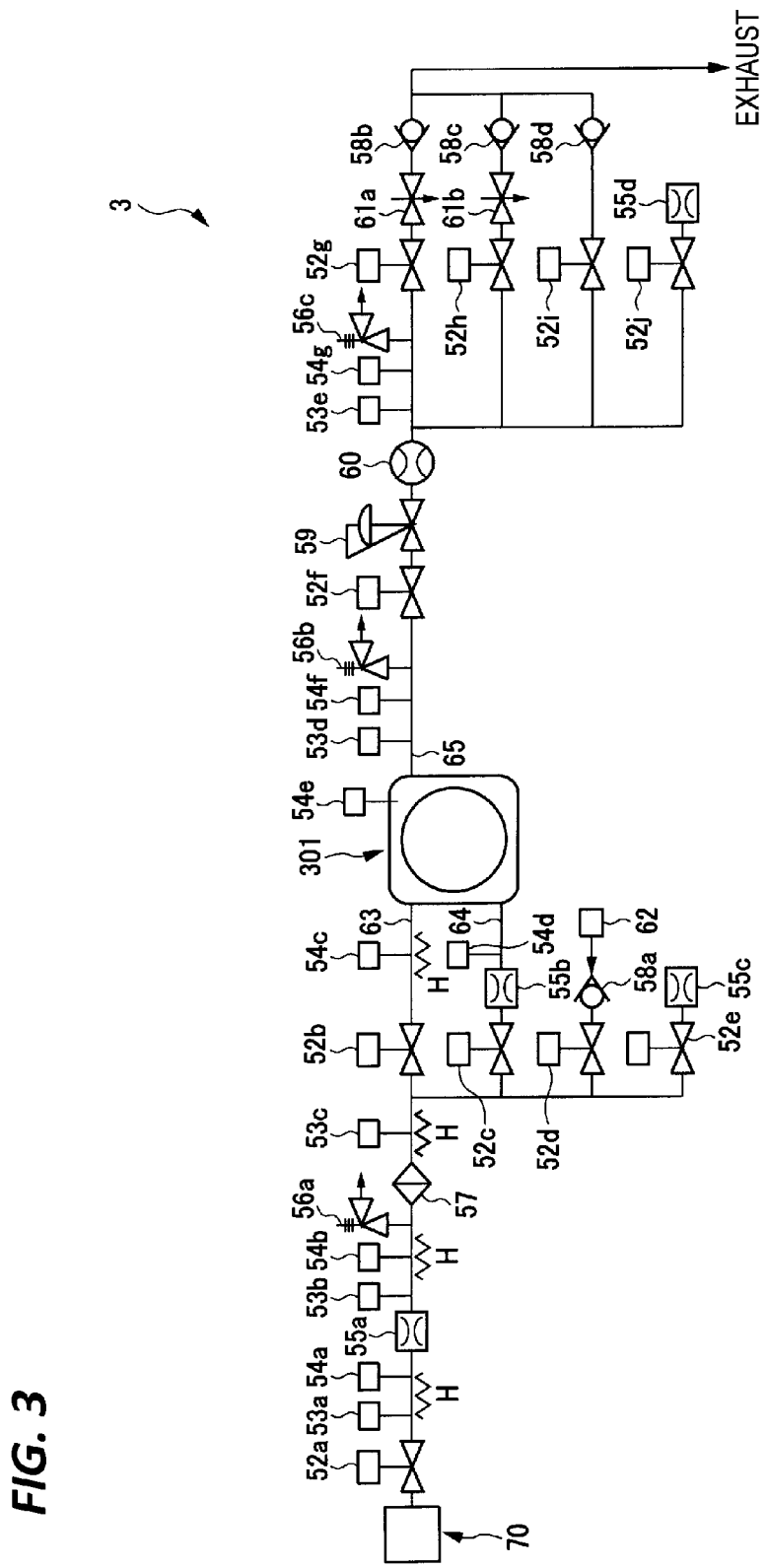
FIG. 3 is a view illustrating an exemplary configuration of an entire system of the supercritical processing apparatus.

FIG. 3 is a view illustrating an exemplary configuration of the entire system of the supercritical processing apparatus 3.

As illustrated in FIG. 3, the supercritical processing apparatus 3 includes a supercritical fluid producing apparatus 70 according to the present exemplary embodiment, and the processing container 301 in which a supercritical fluid processing is performed on the wafer W using a supercritical fluid from the supercritical fluid producing apparatus 70. Of these components, the processing container 301 is the same as described above (see FIG. 2).

The supercritical fluid producing apparatus 70 is provided on the upstream side of the processing container 301. The processing fluid (supercritical fluid) from the supercritical fluid producing apparatus 70 is supplied to the supply lines for circulating the processing fluid in the supercritical processing apparatus 3. A flow on/off valve 52a, an orifice 55a, a filter 57, and a flow on/off valve 52b are provided in this order from the upstream side toward the downstream side between the supercritical fluid producing apparatus 70 and the processing container 301. Meanwhile, in this description, the terms "upstream side" and "downstream side" are determined based on the flowing direction of the processing fluid in a supply line.

The flow on/off valve 52a regulates the on/off state of the supply of the processing fluid from the supercritical fluid producing apparatus 70. In an open state, the flow on/off valve 52a causes the processing fluid to flow in the supply line on the downstream side. In a closed state, the flow on/off valve 52a does not cause the processing fluid to flow in the supply line on the downstream side. When the flow on/off valve 52a is in an open state, a high-pressure processing fluid of, for example, about 16 MPa to 20 MPa (megapascal) is supplied from the supercritical fluid producing apparatus 70 to the supply line via the flow on/off valve 52a. The orifice 55a performs a function to regulate the pressure of the processing fluid supplied from the supercritical fluid producing apparatus 70, and the processing fluid having the pressure regulated to, for example, about 16 MPa may be circulated in the supply line on the downstream side of the orifice 55a. The filter 57 removes foreign substances contained in the processing fluid sent from the orifice 55a, and causes the clean processing fluid to flow toward the downstream side.

The flow on/off valve 52b regulates the on/off state of the supply of the processing fluid into the processing container 301. A first supply line 63 extending from the flow on/off valve 52b to the processing container 301 is connected to the above-described supply port 313 illustrated in FIGS. 2 and 3, and the processing fluid from the flow on/off valve 52b is supplied into the container body 311 of the processing container 301 through the supply port 313 illustrated in FIGS. 2 and 3.

Meanwhile, in the supercritical processing apparatus 3 illustrated in FIG. 3, the supply line between the filter 57 and the flow on/off valve 52b is branched. That is, from the supply line between the filter 57 and the flow on/off valve 52b, a supply line (a second supply line 64) is branched and extends to be connected to the processing container 301 via a flow on/off valve 52c and an orifice 55b, a supply line is branched and extends to be connected to a purging device 62 via a flow on/off valve 52d and a check valve 58a, and a supply line is branched and extends to be connected to the outside via a flow on/off valve 52e and an orifice 55c.

The second supply line 64 connected to the processing container 301 via the flow on/off valve 52c and the orifice 55b supplies the processing fluid into the container body 311 from, for example, the bottom surface of the processing container 301. The second supply line 64 may be used as an auxiliary flow path for supplying the processing fluid into the processing container 301. For example, when a relatively large amount of the processing fluid is supplied into the processing container 301, for example, at the time when the supply of the processing fluid into the processing container 301 is started, the flow on/off valve 52c is adjusted to be in an open state, and the processing fluid having the pressure regulated by the orifice 55b may be supplied into the processing container 301.

The supply line connected to the purging device 62 via the flow on/off valve 52d and the check valve 58a is a flow path for supplying an inert gas such as, for example, nitrogen into the processing container 301, and is used during the time when the supply of the processing fluid from the supercritical fluid producing apparatus 70 into the processing container 301 is stopped. For example, when the processing container 301 is to be filled with the inert gas and kept in the clean state, the flow on/off valves 52d and 52b are adjusted to be in an open state, and the inert gas sent from the purging device 62 to the supply line is supplied into the processing container 301 via the check valve 58a and the flow on/off valves 52d and 52b.

The supply line connected to the outside via the flow on/off valve 52e and the orifice 55c is a flow path for discharging the processing fluid from the supply line. For example, when the processing fluid remaining in the supply line between the flow on/off valves 52a and 52b is to be discharged to the outside at the time when the power of the supercritical processing apparatus 3 is turned off, the flow on/off valve 52e is adjusted to be in an open state, and the supply line between the flow on/off valves 52a and 52b communicates with the outside.

On the downstream side of the processing container 301, a flow on/off valve 52f, an exhaust regulating valve 59, a concentration measuring sensor 60, and a flow on/off valve 52g are provided in this order from the upstream side toward the downstream side.

The flow on/off valve 52f regulates the on/off state of the discharge of the processing fluid from the processing container 301. When the processing fluid is to be discharged from the processing container 301, the flow on/off valve 52f is adjusted to be in an open state, and when the processing fluid is not discharged from the processing container 301, the flow on/off valve 52f is adjusted to be in a closed state. Meanwhile, the supply line (a discharge-side supply line 65) extending between the processing container 301 and the flow on/off valve 52f is connected to the discharge port 314 illustrated in FIG. 2. The fluid in the container body 311 of the processing container 301 is sent toward the flow on/off valve 52f via the fluid discharge header 318 and the discharge port 314 illustrated in FIG. 2.

The exhaust regulating valve 59 regulates a discharge amount of the fluid from the processing container 301 and may be configured with, for example, a back pressure valve. An opening degree of the exhaust regulating valve 59 is adaptively regulated under the control by a controller 4, according to a desired discharge amount of the fluid from the processing container 301. In the present exemplary embodiment, the process of discharging the fluid from the processing container 301 is performed, for example, until the pressure of the fluid inside the processing container 301 reaches a predetermined pressure. Thus, when the pressure of the fluid inside the processing container 301 reaches a predetermined pressure, the exhaust regulating valve 59 regulates the opening degree to shift from the open state to the closed state, so that the discharge of the fluid from the processing container 301 may be stopped.

The concentration measuring sensor 60 measures the IPA concentration contained in the fluid sent from the exhaust regulating valve 59.

The flow on/off valve 52g regulates the on/off state of the discharge of the fluid from the processing container 301 to the outside. When the fluid is to be discharged to the outside, the flow on/off valve 52g is adjusted to be in an open state, and when the fluid is not to be discharged, the flow on/off valve 52g is adjusted to be in a closed state. Meanwhile, an exhaust regulating needle valve 61a and a check valve 58b are provided on the downstream side of the flow on/off valve 52g. The exhaust regulating needle valve 61a regulates a discharge amount of the fluid which is sent via the flow on/off valve 52g, to the outside. An opening degree of the exhaust regulating needle valve 61a is regulated according to a desired discharge amount of the fluid. The check valve 58b suppresses a backflow of the discharged fluid and performs a function to reliably discharge the fluid to the outside.

In the supercritical processing apparatus 3 illustrated in FIG. 3, the supply line between the concentration measuring sensor 60 and the flow on/off valve 52g is branched. That is, from the supply line between the concentration measuring sensor 60 and the flow on/off valve 52g, a supply line is branched and extends to be connected to the outside via a flow on/off valve 52h, a supply line is branched and extends to be connected to the outside via a flow on/off valve 52*i*, and a supply line is branched and extends to be connected to the outside via a flow on/off valve 52*j*.

Similarly to the flow on/off valve 52*g*, the flow on/off valves 52*h* and 52*i* regulate the on/off state of the discharge of the fluid to the outside. On the downstream side of the flow on/off valve 52*h*, an exhaust regulating needle valve 61*b* and a check valve 58*c* are provided so that regulation of a discharge amount of the fluid and suppression of the backflow of the fluid are performed. On the downstream side of the flow on/off valve 52*i*, a check valve 58*d* is provided so that the backflow of the fluid is suppressed. The flow on/off valve 52*j* also regulates the on/off state of the discharge of the fluid to the outside, and on the downstream side of the flow on/off valve 52*j*, an orifice 55*d* is provided so that the fluid may be discharged from the flow on/off valve 52*j* to the outside via the orifice 55*d*. However, in the example illustrated in FIG. 3, the destination of the fluid to be sent to the outside via the flow on/off valves 52*g*, 52*h*, and 52*i* is different from the destination of the fluid to be sent to the outside via the flow on/off valve 52*j*. Thus, it is also possible to send the fluid to a recovery device (not illustrated) via, for example, the flow on/off valves 52*g*, 52*h*, and 52*i*, while discharging the fluid to the atmosphere via the flow on/off valve 52*j*.

When the fluid is to be discharged from the processing container 301, one or more of the flow on/off valves 52*g*, 52*h*, 52*i*, and 52*j* are adjusted to be in an open state. Especially, when the power of the supercritical processing apparatus 3 is turned off, the flow on/off valve 52*j* may be adjusted to be in an open state so that the fluid remaining in the supply line between the concentration measuring sensor 60 and the flow on/off valve 52*g* is discharged to the outside.

Meanwhile, pressure sensors for detecting the pressure of the fluid and temperature sensors for detecting the temperature of the fluid are provided at various positions of the above-described supply lines. In the example illustrated in FIG. 3, a pressure sensor 53*a* and a temperature sensor Ma are provided between the flow on/off valve 52*a* and the orifice 55*a*, a pressure sensor 53*b* and a temperature sensor 54*b* are provided between the orifice 55*a* and the filter 57, a pressure sensor 53*c* is provided between the filter 57 and the flow on/off valve 52*b*, a temperature sensor 54*c* is provided between the flow on/off valve 52*b* and the processing container 301, and a temperature sensor 54*d* is provided between the orifice 55*b* and the processing container 301. Further, a pressure sensor 53*d* and a temperature sensor 54*f* are provided between the processing container 301 and the flow on/off valve 52*f*, and a pressure sensor 53*e* and a temperature sensor 54*g* are provided between the concentration measuring sensor 60 and the flow on/off valve 52*g*. In addition, a temperature sensor 54*e* is provided to detect the temperature of the fluid inside the container body 311 which is the inside of the processing container 301.

In addition, heaters H are provided at arbitrary positions where the processing fluid flows in the supercritical processing apparatus 3. FIG. 3 illustrates the heaters H provided in the supply lines on the upstream side of the processing container 301 (i.e., between the flow on/off valve 52*a* and the orifice 55*a*, between the orifice 55*a* and the filter 57, between the filter 57 and the flow on/off valve 52*b*, and between the flow on/off valve 52*b* and the processing container 301). However, the heaters H may be provided at other positions including the processing container 301 and the supply lines on the downstream side of the processing container 301. Thus, the heaters H may be provided in the entire flow paths throughout which the processing fluid supplied from the supercritical fluid producing apparatus 70 is discharged to the outside. Especially, from the viewpoint of regulating the temperature of the processing fluid supplied to the processing container 301, the heaters H may be provided at positions where the temperature of the processing fluid flowing on the upstream side of the processing container 301 may be regulated.

In addition, a safety valve 56*a* is provided between the orifice 55*a* and the filter 57, a safety valve 56*b* is provided between the processing container 301 and the flow on/off valve 52*f*, and a safety valve 56*c* is provided between the concentration measuring sensor 60 and the flow on/off valve 52*g*. The safety valves 56*a* to 56*c* perform a function to cause the supply lines to communicate with the outside and urgently discharge the fluid in the supply lines to the outside, at the time of abnormality, for example, when the pressure inside the supply lines excessively increases.

[Configuration of Supercritical Fluid Producing Apparatus]

Figure 4:
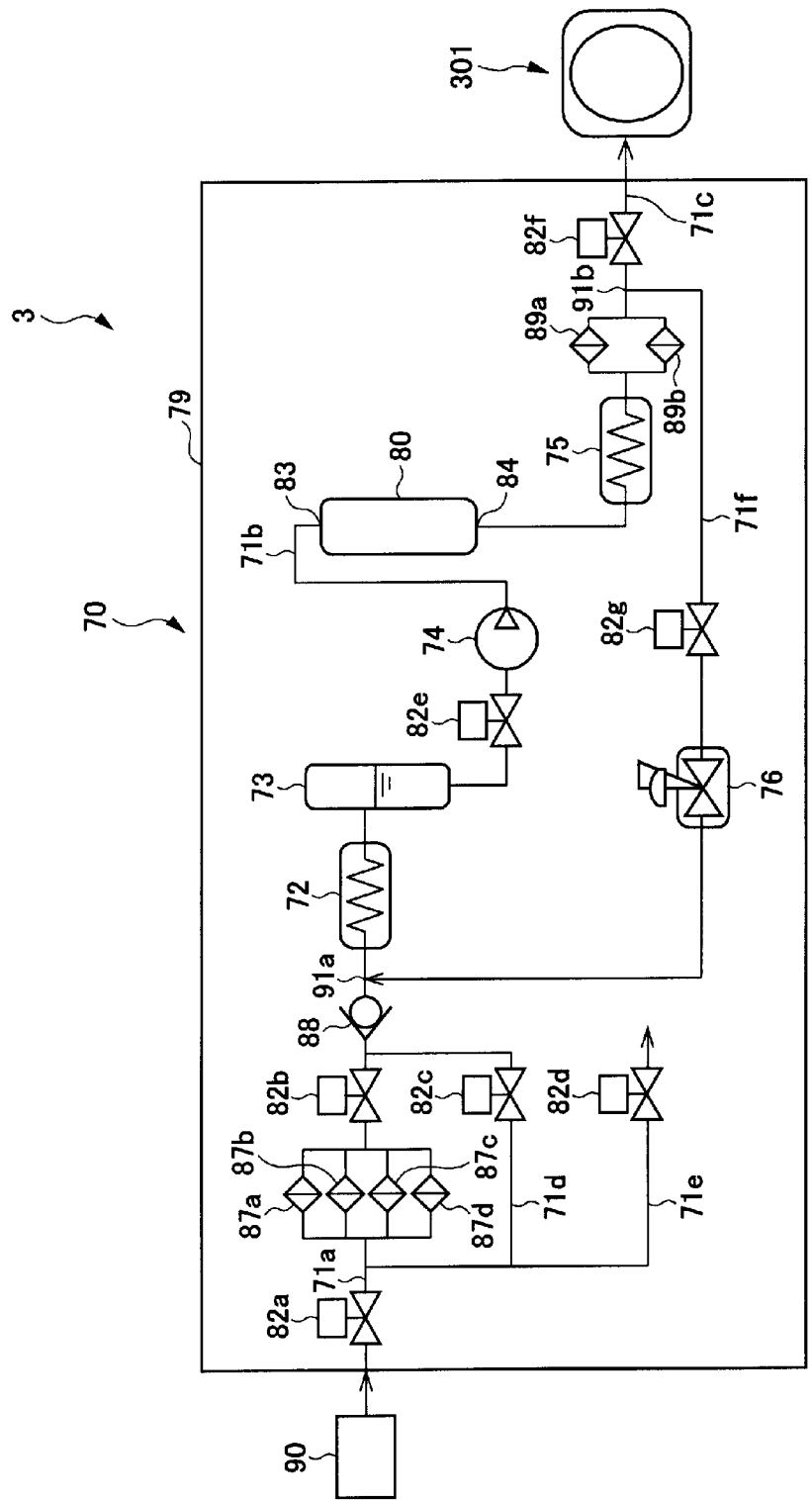
FIG. 4 is a view illustrating an exemplary configuration of a supercritical fluid producing apparatus of the supercritical processing apparatus.

Next, the configuration of the supercritical fluid producing apparatus 70 will be described. FIG. 4 is a flowchart schematically illustrating the configuration of the supercritical fluid producing apparatus 70.

The supercritical fluid producing apparatus 70 includes a gas supply line 71*a*, a cooler 72, a storage tank 73, a pump 74, a buffer tank 80, a heating device 75, and a supercritical fluid supply line 71*c*. The gas supply line 71*a*, the cooler 72, the storage tank 73, the pump 74, the buffer tank 80, the heating device 75, and the supercritical fluid supply line 71*c* are disposed inside a housing 79.

Of these components, the gas supply line 71*a* supplies a gaseous processing fluid (carbon dioxide ($CO_2$) in the present exemplary embodiment; also referred to as a "processing gas") sent from the outside of the supercritical fluid producing apparatus 70 to the side of the cooler 72. In addition, a gas supply tank 90 is provided outside the supercritical fluid producing apparatus 70, and the gas supply line 71*a* is connected to the gas supply tank 90. The gas supply tank 90 stores and supplies the processing gas. The processing gas is supplied from the gas supply tank 90 to the gas supply line 71*a*. Meanwhile, in the gas supply line 71*a*, the pressure of the processing gas is, for example, 4 MPa or more and 6 MPa or less, and the temperature of the processing gas is, for example, −10° C. or higher and 75° C. or lower.

On the gas supply line 71*a* between the gas supply tank 90 and the cooler 72, a flow on/off valve 82*a*, filters 87*a* to 87*d*, a flow on/off valve 82*b*, and a check valve 88 are provided in this order from the upstream side toward the downstream side.

The flow on/off valve 82*a* controls the on/off state of the supply of the processing gas from the gas supply tank 90. In an open state, the flow on/off valve 82*a* causes the processing gas to flow in the gas supply line 71*a* on the downstream side. In a closed state, the flow on/off valve 82*a* does not cause the processing gas to flow in the gas supply line 71*a* on the downstream side. When the flow on/off valve 82*a* is in the open state, the processing gas is supplied from the gas supply tank 90 to the gas supply line 71*a* via the flow on/off valve 82*a*.

Each of the filters 87*a* to 87*d* adsorbs and removes moisture or the like contained in the processing gas flowing in the gas supply line 71*a*, and causes the processing gas from which moisture or the like has been removed to flow toward the downstream side. In this case, a plurality (four) of filters 87*a* to 87*d* are arranged in parallel on the gas supply line 71*a*. As a result, a pressure loss of the processing gas in the gas supply line 71a is suppressed, and the maintenance of the filters 87a to 87d is easily performed.

The flow on/off valve 82b controls the on/off state of the supply of the processing gas flowing in the gas supply line 71a. The check valve 88 functions as a check valve that suppresses the processing fluid (the processing gas or liquid) from flowing backward from the cooler 72 toward the upstream side (the side of the filters 87a to 87d).

In FIG. 4, the gas supply line 71a is branched between the filters 87a to 87d and the flow on/off valve 82a. That is, from the gas supply line 71a between the filters 87a to 87d and the flow on/off valve 82a, a bypass processing gas line 71d is branched and extends to send the processing gas from the flow on/off valve 82a into the check valve 88 without passing through the filters 87a to 87d, and a vent line 71e is branched and extends to be connected to the outside via a flow on/off valve 82d.

A flow on/off valve 82c is provided on the bypass processing gas line 71d. The flow on/off valve 82c controls the on/off state of the supply of the processing gas flowing in the bypass processing gas line 71d. The vent line 71e is intended to discharge the gas from the gas supply line 71a to the outside. A flow on/off valve 82d is provided on the vent line 71e. The flow on/off valve 82d controls whether to discharge the processing gas flowing in the vent line 71e to the outside. For example, when the processing gas remaining in the gas supply line 71a between the flow on/off valve 82a and the check valve 88 is to be discharged to the outside at the time when the power of the supercritical fluid producing apparatus 70 is turned off, the flow on/off valve 82d is adjusted to be in an open state, and the gas supply line between the flow on/off valve 82a and the check valve 88 communicates with the outside.

The gas supply line 71a is connected to the inlet side of the cooler 72. The cooler 72 cools the processing gas from the gas supply line 71a so as to liquefy the processing gas and produce a liquid type processing fluid (also referred to as a "processing liquid"). Cooling water is supplied to the cooler 72 from an external chiller (not illustrated), and the processing gas is cooled by the cooling water. The processing gas is cooled by the cooler 72 and produced into the processing liquid so that the processing fluid (the processing liquid) may be sent into the side of the buffer tank 80 by using a pump 74. Meanwhile, on the outlet side of the cooler 72, the pressure of the processing liquid is, for example, 4 MPa or more and 6 MPa or less, and the temperature of the processing liquid is, for example, 0° C. or higher and 5° C. or lower.

A liquid supply line 71b is connected to the outlet side of the cooler 72. This liquid supply line 71b supplies the processing liquid from the cooler 72 to the side of the buffer tank 80. The liquid supply line 71b extends from the cooler 72 to the buffer tank 80 via the storage tank 73 and the pump 74 in this order.

A storage tank 73 and a flow on/off valve 82e are provided on the liquid supply line 71b between the cooler 72 and the pump 74. Of these components, the storage tank 73 temporarily stores the processing liquid produced by being cooled and liquefied in the cooler 72. Cooling water is supplied to the storage tank 73 from, for example, the above-mentioned chiller so that the processing liquid in the storage tank 73 is cooled. In this case, the processing liquid in the storage tank 73 is kept at, for example, 0° C. or higher and 5° C. or lower. As described above, the storage tank 73 is provided between the cooler 72 and the pump 74 so that the processing liquid produced by being liquefied in the cooler 72 may be stably sent into the pump 74.

The flow on/off valve 82e controls the on/off state of the supply of the processing liquid sent from the storage tank 73 and is configured such that in an open state, the flow on/off valve 82e causes the processing liquid to flow in the liquid supply line 71b on the downstream side, and in a closed state, the flow on/off valve 82e does not cause the processing liquid to flow in the liquid supply line 71b on the downstream side. When the flow on/off valve 82e is in the open state, the processing liquid from the storage tank 73 is supplied to the pump 74 via the liquid supply line 71b.

The inlet side of the pump 74 is connected to the cooler 72 via the storage tank 73. The pump 74 is configured with, for example, a high-pressure metering pump and performs a function to increase the pressure of the processing liquid from the cooler 72 and send out the processing liquid toward the outlet side of the pump 74. On the outlet side of the pump 74, the pressure of the processing liquid exceeds a threshold pressure required to change the processing liquid into a supercritical fluid and is increased to, for example, 7.4 MPa or more and 23 MPa or less. On the outlet side of the pump 74, the temperature of the processing liquid is, for example, 15° C. or higher and 30° C. or lower.

A buffer tank 80 is connected to the outlet side of the pump 74. The buffer tank 80 absorbs a pressure fluctuation or pulsation of the processing fluid (the processing liquid or the supercritical fluid) sent out from the pump 74 and flowing in the supply line between the pump 74 and the heating device 75 (the liquid supply line 71b and the supercritical fluid supply line 71c). The processing liquid from the liquid supply line 71b flows into the buffer tank 80. The processing liquid flowing into the buffer tank 80 is heated in the buffer tank 80. As a result, the temperature of the processing liquid exceeds the threshold temperature required for the change into the supercritical fluid, and the processing liquid becomes a processing fluid in a supercritical state (also referred to as a "supercritical fluid") and flows out from the buffer tank 80.

In the present exemplary embodiment, an inlet port 83 into which the processing liquid from the pump 74 flows is formed at a predetermined position on the buffer tank 80, and an outlet port 84 through which the supercritical fluid flows out is formed at a position on the buffer tank 80 which is different from the inlet port 83. Since a flow of the processing fluid (the processing liquid or the supercritical fluid) from the inlet port 83 toward the outlet port 84 occurs inside the buffer tank 80, particles do not stay in the buffer tank 80. This suppresses the problem in that particles staying in the buffer tank 80 are intermittently discharged from the buffer tank 80 and sent to the side of the processing container 301. On the outlet side of the buffer tank 80, the pressure of the supercritical fluid is, for example, 7.4 MPa or more and 23 MPa or less. Further, on the outlet side of the buffer tank 80, the temperature of the supercritical fluid is increased to, for example, 20° C. or higher and 40° C. or lower. The detailed configuration of the buffer tank 80 will be described later.

The supercritical fluid supply line 71c is connected to the outlet side of the buffer tank 80. The supercritical fluid supply line 71c sends the supercritical fluid from the buffer tank 80 to the outside of the supercritical fluid producing apparatus 70 (toward the side of the processing container 301) via the heating device 75. The supercritical fluid supply line 71c extends from the buffer tank 80 to the outside of the supercritical fluid producing apparatus 70 via the heating device 75.

The heating device 75 is connected to the outlet side of the buffer tank 80. The heating device 75 heats the supercritical fluid from the buffer tank 80. When the supercritical fluid is heated in the heating device 75, the supercritical fluid is heated to a temperature suitable for a supercritical drying processing in the processing container 301. Specifically, the temperature of the supercritical fluid is increased to, for example, 40° C. or higher and 100° C. or lower on the outlet side of the heating device 75. Further, on the outlet side of the heating device 75, the pressure of the supercritical fluid is, for example, 7.4 MPa or more and 23 MPa or less.

On the supercritical fluid supply line 71c on the downstream side of the heating device 75, filters 89a and 89b and a flow on/off valve 82f are provided in this order from the upstream side toward the downstream side.

Each of the filters 89a and 89b removes particles or the like contained in the supercritical fluid flowing in the supercritical fluid supply line 71c and causes the supercritical fluid from which particles or the like has been removed to flow toward the downstream side. In this case, a plurality (two) of filters 89a and 89b are arranged in parallel on the supercritical fluid supply line 71c. As a result, a pressure loss of the supercritical fluid in the supercritical fluid supply line 71c is suppressed, and the maintenance of the filters 89a and 89b is easily performed.

The flow on/off valve 82f controls the on/off state of the supply of the supercritical fluid flowing in the supercritical fluid supply line 71c. In this case, the flow on/off valve 82f controls whether to send out the supercritical fluid from the supercritical fluid producing apparatus 70 to the processing container 301. That is, in a state where the flow on/off valve 82f is opened, the supercritical fluid is supplied from the supercritical fluid producing apparatus 70 to the processing container 301. Meanwhile, in a state where the flow on/off valve 82f is closed, the supercritical fluid is not supplied from the supercritical fluid producing apparatus 70 to the processing container 301.

The downstream side of the heating device 75 and the upstream side of the cooler 72 are connected to each other by a circulation line 71f. More specifically, the circulation line 71f interconnects a downstream-side branched portion 91b positioned between the filters 89a and 89b and the flow on/off valve 82f, and an upstream-side branched portion 91a positioned between the check valve 88 and the cooler 72.

In addition, a flow on/off valve 82g and a pressure regulating valve 76 are provided on the circulation line 71f. Of these components, the flow on/off valve 82g controls the on/off state of the passage of the processing fluid (the supercritical fluid) flowing in the circulation line 71f from the downstream-side branched portion 91b toward the upstream-side branched portion 91a. That is, in a state where the flow on/off valve 82g is opened, the supercritical fluid flows from the downstream-side branched portion 91b toward the pressure regulating valve 76. Meanwhile, in a state where the flow on/off valve 82f is closed, the supercritical fluid does not flow from the downstream-side branched portion 91b toward the pressure regulating valve 76. The flow on/off valve 82g is usually maintained in the open (turned-on) state during the time when the supercritical fluid producing apparatus 70 produces the supercritical fluid. Thus, the supercritical fluid supply line 71c and the pressure regulating valve 76 are usually maintained in a state of communicating with each other.

The pressure regulating valve 76 performs a function to keep constant the pressure of the processing fluid (the supercritical fluid) flowing therein. When the pressure of the processing fluid flowing in the pressure regulating valve 76 exceeds a preset pressure threshold value, the pressure regulating valve 76 causes the processing fluid to flow from the inlet side of the pressure regulating valve 76 (the side of the downstream-side branched portion 91b) toward the outlet side thereof (the side of the upstream-side branched portion 91a). Meanwhile, when the pressure of the processing fluid flowing in the pressure regulating valve 76 does not exceed the pressure threshold value, the pressure regulating valve 76 does not cause the processing fluid to flow.

Meanwhile, when the pressure of the processing fluid flowing in the pressure regulating valve 76 exceeds the pressure threshold value, the processing fluid flows from the inlet side of the pressure regulating valve 76 (the side of the downstream-side branched portion 91b) toward the outlet side thereof (the side of the upstream-side branched portion 91a). The pressure of the processing fluid that has passed through the pressure regulating valve 76 decreases, and the processing fluid is vaporized and returns to the processing gas. This processing gas passes through the upstream-side branched portion 91a and flows into the cooler 72 again. After a certain amount of the processing fluid flows from the inlet side of the pressure regulating valve 76 toward the outlet side thereof, the pressure in the circulation line 71f connected to the inlet side of the pressure regulating valve 76 decreases. Thereafter, when the pressure inside the pressure regulating valve 76 falls below the pressure threshold value, the flow of the processing fluid inside the pressure regulating valve 76 is stopped. By appropriately setting the pressure threshold value of the pressure regulating valve 76 as described above, it is possible to set an upper limit of the pressure of the supercritical fluid sent into the processing container 301 from the supercritical fluid producing apparatus 70. Specifically, when the pressure of the supercritical fluid sent into the processing container 301 from the supercritical fluid producing apparatus 70 exceeds the pressure threshold value, a part of the supercritical fluid flows out toward the upstream-side branched portion 91a via the pressure regulating valve 76. As a result, the pressure of the supercritical fluid flowing in the circulation line 71f decreases to the pressure threshold value. In this way, the pressure of the supercritical fluid sent into the processing container 301 from the supercritical fluid producing apparatus 70 is kept constant.

[Configuration of Buffer Tank]

Figure 5:
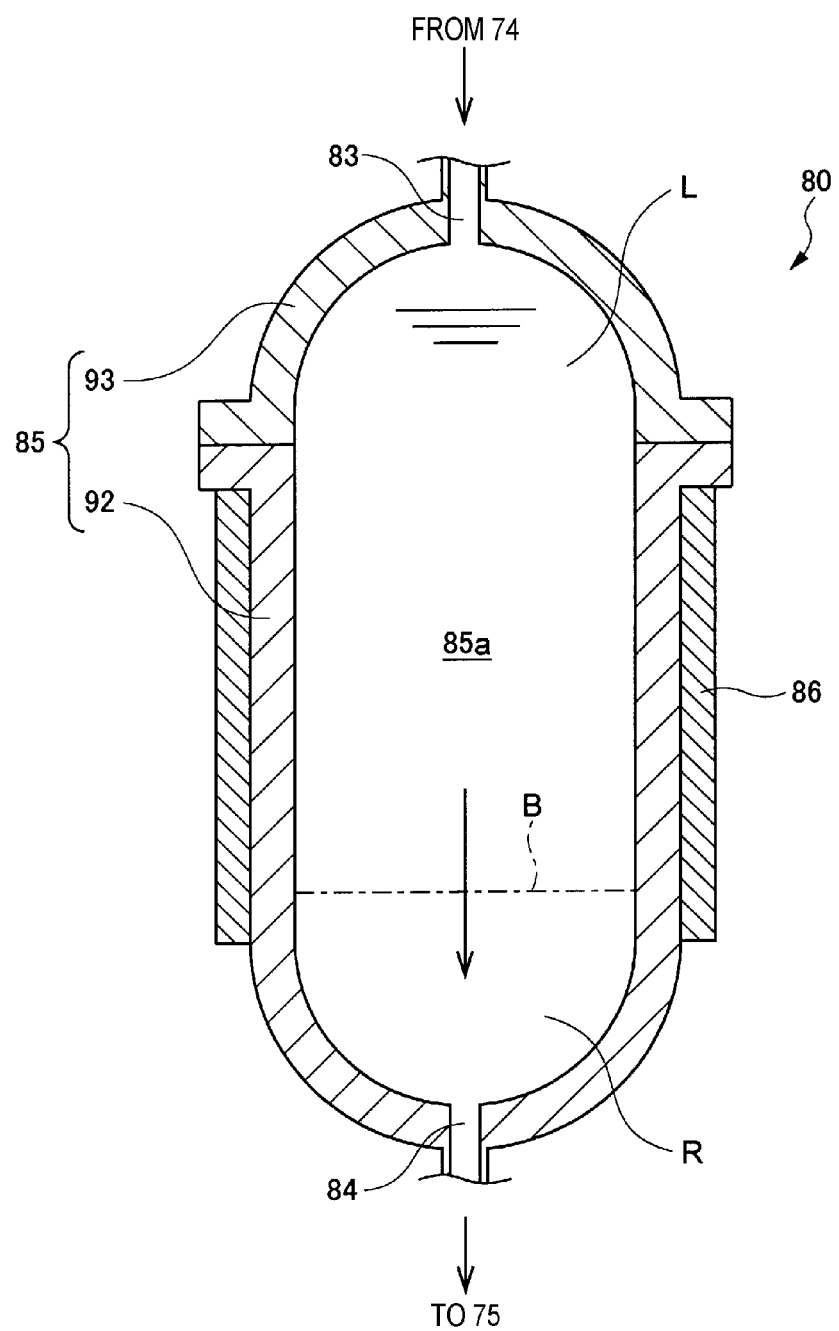
FIG. 5 is a vertical sectional view schematically illustrating a buffer tank.

Next, the configuration of the above-described buffer tank 80 will be described. FIG. 5 is a sectional view schematically illustrating the configuration of the buffer tank 80.

As illustrated in FIG. 5, the buffer tank 80 includes a buffer tank body 85 into which a processing liquid L is sent, and a heater 86 that heats the processing liquid L sent into the buffer tank body 85.

Of these components, the buffer tank body 85 stores the processing fluid (the processing liquid L or a supercritical fluid R) supplied from the pump 74, and has a substantially cylindrical shape as a whole. In FIG. 5, the buffer tank body 85 includes a cylindrical portion 92 positioned at a lower side and a lid portion 93 positioned at an upper side and detachably connected to the cylindrical portion 92. When the cylindrical portion 92 and the lid portion 93 are connected to each other, an internally sealed accommodation space 85a is formed. The processing fluid (the processing liquid L or supercritical fluid R) is stored in the accommodation space 85a. The volume of the buffer tank body 85 is, for example, 500 ml or more and 1,000 ml or less. When the buffer tank body 85 is configured to have the large volume, a pressure fluctuation or pulsation of the processing fluid (the processing liquid or supercritical fluid) may be more reliably absorbed.

The heater 86 is mounted to be wrapped around the buffer tank body 85. The heater 86 heats the high-pressure processing liquid L sent into the buffer tank body 85, so as to increase the temperature of the processing liquid L and change the processing liquid L into the supercritical fluid R. For example, the temperature of the processing liquid L is increased by the heater 86 to a temperature exceeding a threshold temperature required for the change into the supercritical fluid R, for example, 31° C. or higher. In this case, the heater 86 covers the side surface portion of the buffer tank body 85 throughout the entire circumference thereof. However, without being limited thereto, the heater 86 may cover a part of the side surface portion of the buffer tank body 85 in the circumferential direction. Alternatively, the heater 86 may cover the bottom portion of the buffer tank body 85 along with the side surface portion thereof.

As illustrated in FIG. 5, during the time when the buffer tank 80 is used, the inside of the buffer tank body 85 becomes a state where the processing liquid L exists in the upper portion of the accommodation space 85a, and the supercritical fluid R exists in the lower portion of the accommodation space 85a. Since the processing liquid L and the supercritical fluid R coexist in the buffer tank body 85, in a case where the pressure of the supercritical fluid R fluctuates when the supercritical fluid R is supplied into the processing container 301, or in a case where a pulsation occurs in the processing liquid L sent from the pump 74, an interface B between the non-compressive processing liquid L and the compressive supercritical fluid R moves up and down. When the interface B moves up and down, it is possible to absorb the fluctuation of the pressure of the supercritical fluid R when the supercritical fluid R is supplied into the processing container 301 or the pulsation of the processing liquid L sent from the pump 74.

In addition, the buffer tank 80 includes the inlet port 83 into which the processing liquid L from the pump 74 flows, and the outlet port 84 through which the supercritical fluid R produced in the buffer tank 80 flows out toward the heating device 75. In the present exemplary embodiment, the inlet port 83 is positioned at the vertically upper portion of the buffer tank 80, specifically, at the top end of the lid portion 93. The outlet port 84 is positioned at the vertically lower portion of the buffer tank 80, specifically, at the bottom end of the cylindrical portion 92. As a result, what occurs inside the buffer tank body 85 is the normal flow in which the processing liquid L introduced from the inlet port 83 is changed into the supercritical fluid R and flows out from the outlet port 84. Thus, even when particles are mixed in the processing liquid L flowing into the buffer tank body 85, the particles may be reliably discharged from the outlet port 84 without staying in the buffer tank body 85. This suppresses the problem in that the particles staying in the buffer tank 80 are intermittently discharged from the buffer tank 80 and sent to the side of the processing container 301.

[Method of Producing Supercritical Fluid]

Next, a method of producing a supercritical fluid from a processing gas using the supercritical fluid producing apparatus 70 will be described with reference to FIG. 4.

First, the flow on/off valves 82a, 82b, 82e, 82f, and 82g of the supercritical fluid producing apparatus 70 are brought into an open (turned-on) state, and the flow on/off valves 82c and 82d are brought into a closed (turned-off) state.

Next, a gaseous processing fluid (a processing gas) is supplied from the gas supply tank 90 to the supercritical fluid producing apparatus 70. This processing gas flows through the gas supply line 71a of the supercritical fluid producing apparatus 70 and is sent to the cooler 72. Meanwhile, during this time, the processing gas passes through the flow on/off valve 82a, the filters 87a to 87d, the flow on/off valve 82b, and the check valve 88, in this order, that are provided on the gas supply line 71a. Then, when the processing gas passes through the filters 87a to 87d, moisture contained in the processing gas is removed.

Next, in the cooler 72, the processing gas from the gas supply line 71a is cooled, and as a result, a liquid type processing fluid (a processing liquid) is produced. This processing liquid passes through the liquid supply line 71b to be sent from the cooler 72 to the storage tank 73 and temporarily stored in the storage tank 73. Next, the processing liquid from the storage tank 73 is supplied to the buffer tank 80 using the pump 74. Meanwhile, the processing liquid passes through the flow on/off valve 82e provided in the liquid supply line 71b and is pressurized by the pump 74 to a pressure of, for example, about 7.4 MPa or more and 23 MPa or less.

Subsequently, the high-pressure processing liquid flows into the buffer tank 80. The processing liquid flowing into the buffer tank 80 is heated in the buffer tank 80 so as to become a processing fluid in a supercritical state (a supercritical fluid) and flow out from the buffer tank 80. Meanwhile, on the outlet side of the buffer tank 80, the pressure of the supercritical fluid is, for example, 7.4 MPa or more and 23 MPa or less, and the temperature of the supercritical fluid is, for example, 40° C. or higher and 100° C. or lower.

As described above, the processing liquid and the supercritical fluid coexist in the buffer tank 80 so that the interface between the non-compressive processing liquid and the compressive supercritical fluid moves up and down. Thus, even when the pressure of the supercritical fluid in the supercritical fluid supply line 71c fluctuates by the switching of the on/off state of the flow on/off valve 82f, the interface between the processing liquid and the supercritical fluid inside the buffer tank 80 moves up and down, so that the pressure fluctuation may be absorbed. Further, when the interface between the processing liquid and the supercritical fluid inside the buffer tank 80 moves up and down, the pulsation of the processing liquid sent from the pump 74 may be absorbed.

Subsequently, the supercritical fluid flowing out from the buffer tank 80 reaches the heating device 75 via the supercritical fluid supply line 71c. In the heating device 75, the supercritical fluid is heated to a temperature suitable for the supercritical drying processing in the processing container 301 and reaches a temperature of, for example, about 40° C. or higher to 100° C. or lower.

Next, since the supercritical fluid has been heated by the heating device 75, the supercritical fluid passes through the filters 89a and 89b and the flow on/off valve 82f, in this order, that are provided on the supercritical fluid supply line 71c, and flows out from the supercritical fluid producing apparatus 70 to the processing container 301. During this time, particles or the like in the supercritical fluid are removed by the filters 89a and 89b.

Meanwhile, a part of the supercritical fluid is branched from the supercritical fluid supply line 71c at the downstream-side branch portion 91b and flows into the circulation line 71f. In this circulation line 71f, the supercritical fluid reaches the pressure regulating valve 76 via the flow on/off valve 82g. Then, when the pressure of the supercritical fluid flowing in the pressure regulating valve 76 exceeds the preset pressure threshold value, the pressure regulating valve 76 causes the supercritical fluid to flow toward the side of the upstream-side branched portion 91a. At this time, the pressure of the supercritical fluid that has passed through the pressure regulating valve 76 decreases, and the supercritical fluid is vaporized and returned to the processing gas. The processing gas passes through the upstream-side branched portion 91a and flows into the cooler 72 again. Meanwhile, when the pressure of the supercritical fluid does not exceed the pressure threshold value, the pressure regulating valve 76 does not cause the supercritical fluid to flow. In this way, the pressure of the supercritical fluid sent from the supercritical fluid producing apparatus 70 into the processing container 301 is kept constant.

[Supercritical Drying Processing]

Next, a method of performing an IPA drying processing using the supercritical processing apparatus 3 of the present exemplary embodiment will be described.

First, the wafer W that has been subjected to the cleaning processing in the cleaning apparatus 2 is conveyed to the supercritical processing apparatus 3. In this cleaning apparatus 2, removal of particles or organic contaminants with an SC1 liquid which is an alkaline chemical liquid, rinse cleaning with deionized water (DIW) which is a rinse liquid, removal of a natural oxide film with dilute hydrofluoric acid aqueous solution (DHF) which is an acidic chemical liquid, and rinse cleaning with DIW are performed in this order. Finally, IPA is applied to the wafer surface. Then, in this state, the wafer W is carried out from the cleaning apparatus 2 and conveyed to the processing container 301 of the supercritical processing apparatus 3.

The conveyance to the processing container 301 is performed by using, for example, the second conveyance mechanism 161 (see FIG. 1). When the wafer is conveyed to the processing container 301, the second conveyance mechanism 161 delivers the wafer W to the holding plate 316 which stands by at the delivery position, and then, retreats from the position above the holding plate 316.

Next, the holding plate 316 is caused to slide horizontally such that the holding plate 316 moves to the processing position inside the container body 311. Subsequently, before the IPA applied to the surface of the wafer W is dried, the flow on/off valves 52b and 52c are opened so that the high-pressure supercritical fluid from the supercritical fluid producing apparatus 70 is supplied into the container body 311 through the first supply line 63 and the second supply line 64 (see FIG. 3). As a result, the pressure inside the container body 311 is increased to, for example, about 14 MPa to 16 MPa.

Meanwhile, in the container body 311, when the supercritical fluid supplied into the container body 311 comes into contact with the IPA applied to the wafer W, the applied IPA is gradually dissolved in the supercritical fluid and gradually replaced with the supercritical fluid. Then, as the replacement of the IPA with the supercritical fluid between the patterns of the wafer W is progressed, the IPA is removed from the space between the patterns P, and finally, the space is filled with only the supercritical fluid. As a result, the liquid IPA on the surface of the wafer W is gradually replaced with the supercritical fluid, and since no interface is formed between the liquid IPA and the supercritical fluid in the equilibrium state, the fluid on the surface of the wafer W may be replaced with the supercritical fluid without causing a pattern collapse.

Thereafter, when preset time elapses after the supply of the supercritical fluid into the container body 311, and the surface of the wafer W becomes the state where the IPA thereon has been replaced with the supercritical fluid, the flow on/off valve 52f is opened to discharge the atmosphere inside the container body 311 from the fluid discharge header 318 toward the outside of the container body 311. As a result, the pressure inside the container body 311 gradually decreases, and the processing fluid inside the container body 311 is changed from the supercritical state to the gas state. At this time, since no interface is formed between the supercritical state and the gas, the wafer W may be dried without causing the surface tension to act on the patterns formed on the surface of the wafer W.

After the supercritical processing of the wafer W is completed according to the above-described process, purging toward the fluid discharge header 318 is performed by supplying $N_2$ gas from a purging gas supply line (not illustrated), in order to discharge the gaseous processing fluid remaining in the container body 311. When the purging is completed by supplying $N_2$ gas for predetermined time, and the inside of the container body 311 returns to the atmospheric pressure, the holding plate 316 is caused to move horizontally to the delivery position, and the wafer W which has been subjected to the supercritical processing is carried out using the second conveyance mechanism 161.

As described above, according to the present exemplary embodiment, the inlet port 83 into which the processing fluid (the processing liquid) from the pump 74 flows is formed at the predetermined position on the buffer tank 80, and the outlet port 84 through which the processing fluid (the supercritical fluid) flows out is formed at the position on the buffer tank 80 which is different from the inlet port 83. In this case, since the inlet port and the outlet port are not shared, what occurs inside the buffer tank 80 is the stable flow of the processing fluid (the processing liquid or supercritical fluid) from the inlet port 83 toward the outlet port 84. Thus, even when particles are contained in the processing fluid, the particles do not stay in the buffer tank 80. This suppresses the problem in that the particles staying in the buffer tank 80 are intermittently discharged from the buffer tank 80 and sent to the side of the processing container 301.

According to the present exemplary embodiment, the buffer tank 80 includes the buffer tank body 85 that stores the processing fluid (the processing liquid or supercritical fluid) from the pump 74, and the heater 86 that heats the processing fluid (the processing liquid or supercritical fluid) sent into the buffer tank body 85. Thus, the supercritical liquid may be produced by heating the high-pressure processing liquid send into the buffer tank body 85.

According to the present exemplary embodiment, since the volume of the buffer tank body 85 is 500 ml or more and 1,000 ml or less, the buffer tank body 85 is configured to have the large volume. Thus, the pressure fluctuation or pulsation of the processing fluid (the processing liquid or supercritical fluid) may be reliably absorbed by using the buffer tank 80.

According to the present exemplary embodiment, the inlet port 83 of the buffer tank 80 is positioned at the vertically upper portion of the buffer tank 80, and the outlet port 84 of the buffer tank 80 is positioned at the vertically lower portion of the buffer tank 80. Thus, what occurs inside the buffer tank body 85 is the normal flow of the processing fluid from the upper side toward the lower side. As a result, even when particles are mixed in the processing liquid, the particles may be reliably discharged from the outlet port 84 without staying in the buffer tank body 85.

According to the present exemplary embodiment, the circulation line 71f is provided to interconnect the downstream side of the heating device 75 and the upstream side of the cooler 72, and the pressure regulating valve 76 is provided on the circulation line 71f. Thus, the pressure of the processing fluid (the supercritical fluid) flowing in the pressure regulating valve 76 may be kept constant, and the pressure of the supercritical fluid sent from the supercritical fluid producing apparatus 70 into the processing container 301 may be stabilized.

According to the present exemplary embodiment, the storage tank 73 is provided between the cooler 72 and the pump 74 to store the processing liquid produced by being cooled and liquefied in the cooler 72. Thus, the processing liquid produced by being liquefied in the cooler 72 may be temporarily stored and stably sent into the pump 74.

For example, the processing fluid used for the drying processing may be a fluid other than $CO_2$, and any fluid may be used as the processing fluid as long as the fluid may remove the drying prevention liquid applied to the concave portions of the substrate, in the supercritical state. The drying prevention liquid is not also limited to the IPA, and may be any liquid that is usable as the drying prevention liquid.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A supercritical fluid producing apparatus comprising:
a gas supply line that supplies a gaseous processing fluid from a gas supply tank;
a cooler connected to the gas supply line and configured to cool the gaseous processing fluid from the gas supply line so as to produce a liquid processing fluid;
a pump connected to the cooler and configured to send out the liquid processing fluid from the cooler by increasing a pressure of the liquid processing fluid;
a buffer tank connected to the pump and configured to absorb a pressure fluctuation or pulsation of the processing fluid from the pump, the buffer tank including an accommodation space therein;
a first heater connected downstream from the buffer tank and configured to heat the processing fluid from the buffer tank; and
a supercritical fluid supply line connected to the first heater and configured to send out a processing fluid in a supercritical state from the first heater to a processing chamber,
wherein an inlet port into which the processing fluid from the pump flows is formed at a vertically upper portion of the buffer tank, and an outlet port through which the processing fluid flows out is formed at a vertically lower portion of the buffer tank which is different from the inlet port, such that when a pressure fluctuation or pulsation of the processing fluid from the pump occurs, an interface between the liquid processing fluid in a vertically upper portion of the accommodation space and the processing fluid in the supercritical state in the vertically lower portion of the accommodation space moves up and down, and
the buffer tank includes a buffer tank body that stores the processing fluid from the pump, and a second heater wrapped around the buffer tank and configured to heat the processing fluid inside the buffer tank body into a supercritical state.

2. The supercritical fluid producing apparatus of claim 1, wherein a volume of the buffer tank body is 500 ml or more and 1,000 ml or less.

3. The supercritical fluid producing apparatus of claim 1, wherein a circulation line is provided to interconnect a downstream side of the first heater and an upstream side of the cooler, and a pressure regulating valve is provided in the circulation line.

4. The supercritical fluid producing apparatus of claim 1, wherein a storage tank is provided between the cooler and the pump to store the liquid processing fluid liquefied by being cooled in the cooler.

5. A substrate processing apparatus comprising:
the supercritical fluid producing apparatus of claim 1; and
a processing container in which a supercritical fluid processing is performed on a substrate using a processing fluid in a supercritical state from the supercritical fluid producing apparatus.

* * * * *